United States Patent [19]
Schwarzenberger

[11] Patent Number: 5,857,251
[45] Date of Patent: Jan. 12, 1999

[54] MACHINE FOR MACHINING SHEET-LIKE ARTICLES

[75] Inventor: Hermann Schwarzenberger, Wurenlos, Switzerland

[73] Assignee: P. E. Mader AG, Stallikon-Sellenburen, Switzerland

[21] Appl. No.: 754,325

[22] Filed: Nov. 21, 1996

[51] Int. Cl.$^6$ .................................. B23C 3/28; B23D 7/08
[52] U.S. Cl. .................... 29/33 P; 409/158; 409/164; 409/168; 409/225
[58] Field of Search ................... 29/33 P, 563, 29/564, 33 K; 409/198, 80, 184, 225, 138, 123, 219, 221, 132, 228, 145, 159, 163, 164, 165, 168, 167, 158; 198/364.5

[56] References Cited

U.S. PATENT DOCUMENTS

| | | | |
|---|---|---|---|
| 3,592,102 | 7/1971 | Berthiez | 409/219 X |
| 3,673,920 | 7/1972 | Wahlen et al. | 409/198 |
| 4,327,786 | 5/1982 | Markkula | 409/225 |
| 4,541,466 | 9/1985 | Stegherr | 409/123 |
| 4,617,720 | 10/1986 | Palfrey et al. | 409/221 |
| 4,738,573 | 4/1988 | Johnson, Jr. | 409/184 |
| 4,742,615 | 5/1988 | Lopez | 409/132 X |
| 4,985,982 | 1/1991 | Löhr et al. | 409/228 X |
| 5,002,108 | 3/1991 | Jenkner | 409/225 X |
| 5,492,440 | 2/1996 | Spaan et al. | 409/80 |
| 5,706,568 | 1/1998 | Nenadic et al. | 409/138 X |

OTHER PUBLICATIONS

Prospectus: FILOTEC KSM 24/30, P.E. Mäder AB, Switzerland.

*Primary Examiner*—William R. Briggs
*Attorney, Agent, or Firm*—Jacobson, Price, Holman & Stern, PLLC

[57] ABSTRACT

The machine for the machining of sheet-like articles (12) has a toolholder (90) fitted with a milling cutter (92). Said toolholder can be positioned in the direction of the arrow (x). The clamping device (10) capable of being moved in and counter to the direction of the arrow (y) has clamps (20, 22, 24), of which the first clamp (20) and second clamp (22) are provided with a centering pin (41, 41'). The article (12) to be machined has centering holes which are arranged at the corner points of a right-angled isosceles triangle, the lateral side length of which corresponds to the spacing of the centering pins (41, 41'). The article (12) to be machined can thereby be inserted into the clamping device (10) in two positions rotated through 90° relative to one another. In order, after machining in one direction, to rotate the article (12) through 90° for machining in the other direction, the machine has a rotation device (14), the axis of rotation (16) of which is displaceable along a straight positioning line (50) and, as seen in the direction of the arrow (y), can be locked centrally between the centering pins (41, 41'). The straight positioning line (50) forms an angle of 45° with a straight base line (48) which runs through the centering pins (41, 41').

16 Claims, 3 Drawing Sheets

MACHINE FOR MACHINING SHEET-LIKE ARTICLES

BACKGROUND OF THE INVENTION

1. Field of the Invention

The present invention relates to a machine and a method for the machining, in particular scoring, of sheet-like articles, and to a printed circuit board which is intended to be machined in a machine of this type and by means of a method of this type.

2. Description of the Prior Art

Known machines for the scoring of printed circuit boards have a clamping device movable back and forth and possessing two clamps. Each of these clamps is assigned a centering pin. The printed circuit boards to be scored conventionally have a square or rectangular shape and are provided with a centering hole in each corner region. Before a number of identical printed circuit boards are ever machined, the clamps are set in such a way that the spacing of the centering pins corresponds to the spacing of the centering holes which are present in the two corner regions adjacent to one of the edges of the printed circuit boards. For machining, in each case a printed circuit board is inserted into the clamps in such a way that the centering pins come into engagement with the corresponding centering holes. By moving the clamping device back and forth in the machining direction and by displacing the scoring tool in a direction at right angles to the machining direction after each stroke of the clamping device, the printed circuit board is given a plurality of scores in a first direction. This operation is repeated until all the printed circuit boards are scored in this direction. During the processing of rectangular printed circuit boards, the clamps now have to be reset in such a way that the spacing of the centering pins corresponds to the spacing of the centering holes arranged in the corner regions which are adjacent to an edge running at right angles to the first-mentioned edge. The printed circuit boards already machined in one direction are then rotated in succession through 90°, once again inserted into the clamps and scored in the other direction. A disadvantage of these known machines is that the output of scored printed circuit boards takes place in batches, the printed circuit boards being inserted into and extracted from the clamping device either by hand or by means of automatic loading and unloading mechanisms. For the subsequent machining of the scored printed circuit boards, continuous output is often desired, for example in order to avoid intermediate storage. The known scoring machines cannot satisfy this requirement.

SUMMARY OF THE INVENTION

Proceeding from this state of the art, the object of the present invention is to provide a generic machine which, whilst being of simple design, allows a continuous output of machined articles. Furthermore, the object of the invention is to propose a method for the machining of sheet-like articles which guarantees a continuous output when the articles are machined in two directions running at right angles to one another. A printed circuit board which is particularly suitable for being machined in a machine according to the invention and by means of the method according to the invention is also to be provided.

Continuous output of machined articles is achieved in that, after machining, each of the articles is rotated in one direction and immediately thereafter is then machined in the second direction. The simple design of the machine according to the invention is made possible by the basic idea of making on the articles to be machined centering elements, for example centering holes, at the corners of a right-angled isosceles triangle and of rotating the articles about an axis of rotation which runs through the center of the base of this triangle. This makes it possible to retain the articles by means of the clamping device in two directions running at right angles to one another, without the spacing of the centering members of the clamping device having to be changed. Moreover, only rotation through 90°, without a translational displacement of the axis of rotation, is necessary. The axis of rotation can remain stationary. Only when articles having a different spacing of the centering elements are being processed is it necessary to set the clamping device correspondingly and readjust the position of the axis of rotation. To position the axis of rotation, it is merely necessary to displace the latter in the direction of a straight positioning line and to fix it as a function of the spacing of the centering members.

BRIEF DESCRIPTION OF THE DRAWINGS

The invention is now explained in more detail with reference to a scoring machine, shown in the drawing, as an example. In the purely diagrammatic drawing.

DETAILED DESCRIPTION OF THE INVENTION

Figure 1:
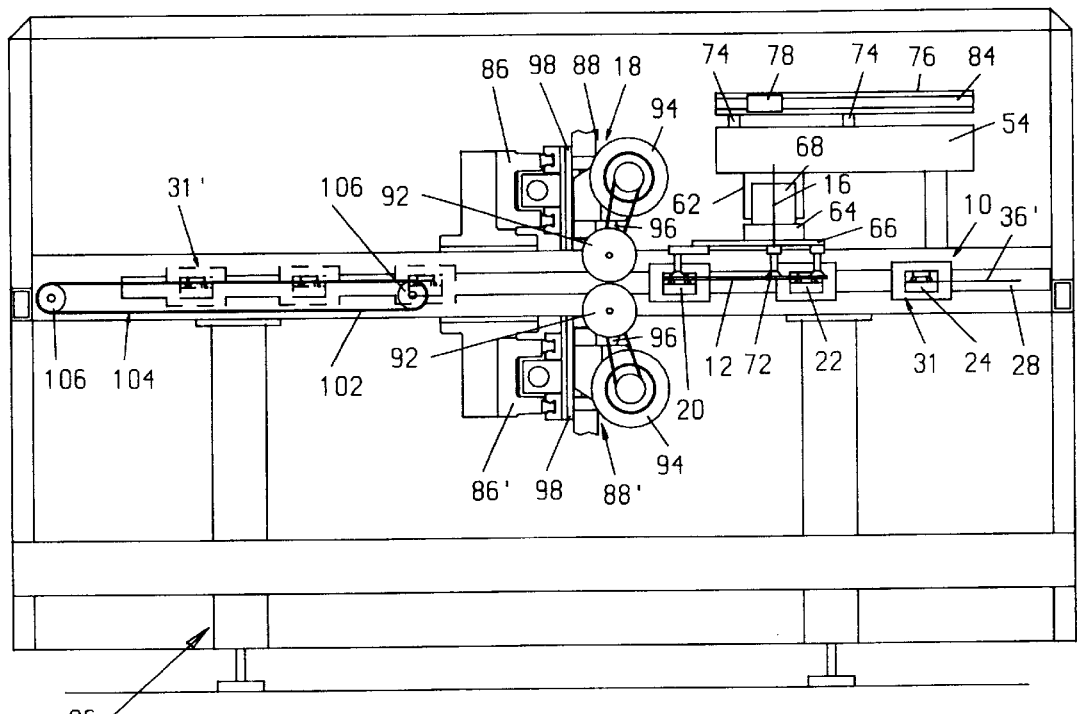
FIG. 1 shows an elevation view of a scoring machine according to the invention.

The scoring machine shown in the Figures has a clamping device 10 for a printed circuit board 12 to be machined, a rotation device for rotating the printed circuit board 12 about an axis of rotation 16, and a twin work head 18 for simultaneously making a score on each of the two sides of the printed circuit board 12.

The clamping device has a first clamp 20, a second clamp 22 and a third clamp 24. All three clamps 20, 22, 24 are displaceably guided in a freely movable manner on a rail 28 running in the horizontal direction and fastened to a machine frame 26. The first clamp 20 is connected to a reversible drive motor 30', for example by means of a belt drive 30, in order to move the clamping device 10 back and forth out of a reception position 31, represented by unbroken lines in FIG. 2, counter to the direction of the arrow y into a delivery position 31', indicated by dot-and-dash lines, and back again in the direction of the arrow y. Fastened to the first clamp 20 is a rod 32' serving as a take-up member 32 for the other two clamps 22, 24. Said rod passes through the second and third clamps 22, 24, and these can be fixed on the rod 32' by means of screws 34. The position of these clamps 22, 24 relative to the first clamp 20 is thus adjustable.

Each of the clamps 20, 22, 24 has a fixed clamping jaw 36 and a clamping tongue 38 cooperating with the latter and capable of being moved from a closed position into an open position and back again. A centering pin 41 acting as a first centering member 40 is fastened to the clamping jaw 36 of the first clamp 20, and a centering pin 41' serving as a second centering member 40' is fastened to the clamping jaw 36 of the second clamp 22. The third clamp 24 has no centering member.

Figure 3:
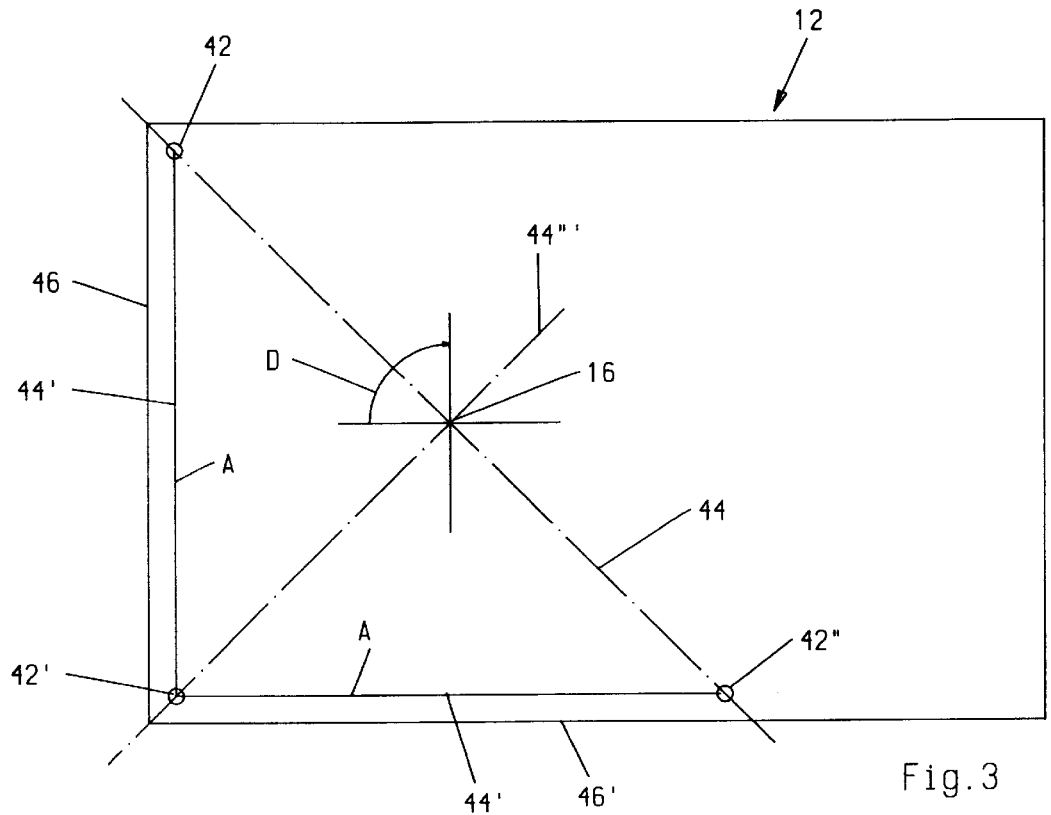
FIG. 3 shows a printed circuit board suitable for being machined in the scoring machine shown in FIGS. 1 and 2.

As can be inferred particularly from FIG. 3, the rectangular printed circuit board 12 has three centering holes 42, 42', 42" which serve as centering elements and which are located at the corner points of a right-angled isosceles triangle 44. The lateral sides of the triangle are designated by 44' and the base by 44". The lateral sides 44', the length of which is A, run parallel to the shorter and longer edge 46, 46' of the printed circuit board 12. The centering holes 42, 42' are located in the corner regions of the printed circuit board 12 which are adjacent to the edge 46, and the positioning hole 42' is arranged between the corner regions adjacent to the edge 46'. It goes without saying that, as regards printed circuit boards of square shape, the positioning holes 42, 42', 42" are located preferably correspondingly in three corner regions of the printed circuit board.

The axis of rotation for rotating the printed circuit board 12 is indicated at 16. It runs at right angles to the printed circuit board 12 and intersects the base 44' centrally between the two centering holes 42, 42'. The axis of rotation 16 thus also intersects the bisecting line, denoted by 44'", of the right angle of the triangle 44 and the mid-perpendiculars to the two lateral sides 44'.

Figure 4:
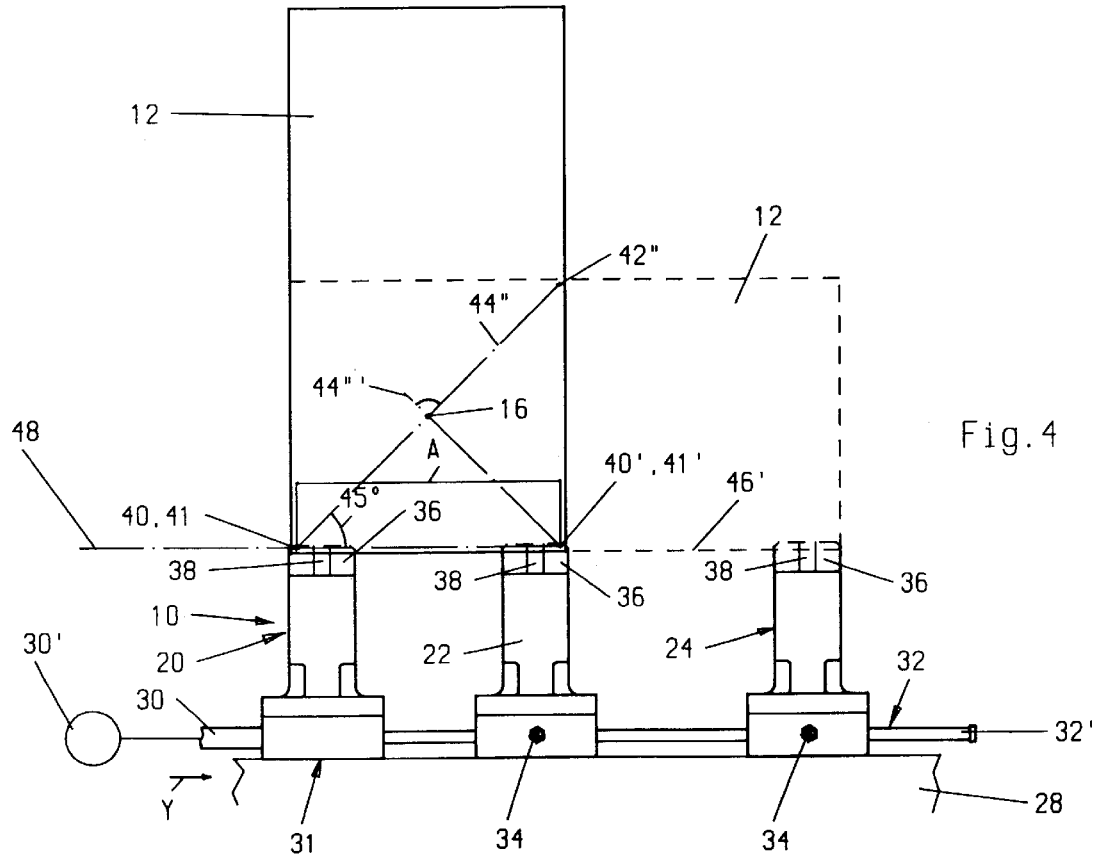
FIG. 4 shows in a top view, and enlarged in relation to FIG. 2, the clamping device of the scoring machine together with a printed circuit board held by this, the two positions of the printed circuit board which are rotated through 90° relative to one another being indicated by unbroken and broken lines respectively.

In FIG. 4, as shown by unbroken lines, the printed circuit board 12 illustrated in FIG. 3 is inserted into the first and second clamps 20, 22 and held by these, in such a way that the centering pins 41, 41' engage into the centering holes 42 and 42'. It goes without saying that, for this purpose, the second clamp 22 is arranged relative to the first clamp 20 in such a way that the center spacing A of the centering pins 40' corresponds to the lateral side length A of the triangle 44 according to FIG. 3.

Broken lines represent the same printed circuit board 12 rotated clockwise through 90° about the axis of rotation 16. In this case, the centering pins 41 and 41' located at an unchanged spacing A engage into the centering holes 42' and 42" respectively. The position of the third clamp 24 is selected, relative to the first clamp 20, in such a way that it holds the printed circuit board 12 in the corner region adjacent to the edge 46' and distant from the centering hole 42'.

The clamping jaws 36 define a clamping plane 36', in which the printed circuit board 12 is located when it is held by the clamping device 10. Furthermore, the centering pins 41, 41' define a straight base line 48 which lies in the clamping plane 36' and which runs through the axes of the centering pins 41, 41'. The axis of rotation 16, about which the printed circuit board 12 is rotated, thus intersects a straight positioning line 50 which runs through the axis of the first centering pin 41 assigned to the first clamp 20, when the clamping device 10 is in the reception position 31, and which forms an angle of 45° with the straight base line 48. Moreover, as measured in the direction of the straight base line 48, the axis of rotation 16 is located centrally between the two centering pins 41 and 41', that is to say it intersects a mid-perpendicular to the straight base line 48.

As can be inferred particularly from FIGS. 1, 2, 5 and 6, the rotation device 14 arranged above the clamping plane 36' has a rectilinear guide rail 54 which is fastened to jibs 52 of the machine frame 26 and which runs parallel to the straight positioning line 50. Guided on the guide rail 54 is a slide 56 which can be clamped and exactly positioned in the desired position by means of a locking device 58. A guide element 59 for guide bars 60 running in the vertical direction and the cylinder of a cylinder/piston assembly 62 are fastened to the slide 56. Fastened to the guide bars 60 at the lower free end of the latter is a carrier 64 which is likewise connected to the piston rod 62' of the cylinder/piston assembly 62. A shaft 65, to the lower end of which a baseplate 66 is fastened, is mounted on the carrier 64 so as to be rotatable about the axis of rotation 16. Furthermore, a rotary drive 68 acting on the shaft 65 is arranged on the carrier 64 for the purpose of rotating the baseplate 66 back and forth through 90°. The baseplate 66 carries arms 70, on each of the free ends of which a suction head 72 is arranged.

A scale carrier 76, which runs parallel to the straight base line 48, is fixedly arranged on two angle carriers 74 fastened to the guide rail 54. Arranged on the scale carrier 76 is a scale 84 which runs parallel to the latter and which is adjusted relative to the first centering member 40 when the clamping device 10 is in the reception position 31. On the scale 84, a traveler 78 is guided displaceably on the measuring rail in the manner of a slide of a sliding caliper, a tappet 78' projecting downward from said traveler 78. Said tappet is received, free of play, in a guide slot 80 which runs at right angles to the straight base line 48 and which is formed on a tappet jib 82 fastened to the slide 56. The exact position of the axis of rotation 16 can be read off directly on the scale 84 by means of the traveler 78.

As can be inferred from FIGS. 1 and 2, the twin work head 18 has in each case above and below the clamping plane 36' a work head 88 or 88' which is mounted on a further rail 86 or 86' running parallel to the clamping plane 36' and at right angles to the rail 28 and to the machining direction y. Each of the work heads 88, 88' has a toolholder 90 for receiving a milling cutter 92. The toolholder 90 is mounted rotatably about an axis running parallel to the further rails 86, 86' and is connected to a drive motor 94 via a drive belt. Both the carrier element 96, on which the toolholder 90 is mounted freely rotatably, and the drive motor 94 are in each case fastened to a work slide 98 which is guided in the corresponding further rail 86 or 86' and which is connected in each case to a generally known actuating drive not shown in the Figure. The two work heads 88, 88' are aligned with one another in such a way that the milling cutters 92 are arranged in one plane and are located opposite one another in respect of the clamping plane 36'. By means of the actuating drives, the work heads 88, 88' can be brought into the desired position synchronously in and counter to the direction of the arrow x and can be retained there.

Furthermore, fastened to each work slide 98 is a bearing body 99, on which a guide disk 99' is freely rotatably mounted coaxially relative to the toolholder 90. The diameter of the guide disk 99' arranged at a short distance from the milling cutter 92 is smaller than that of the milling cutter 92 by about double the score depth; the supporting disks 99' serve for supporting the printed circuit board 12 during machining.

Furthermore, the machine has profile rails 100 which are arranged below the clamping plane 36', are fastened to the machine frame 26, run in the direction of the arrow y, form a sliding plane and are spaced from one another, as seen in the direction of the arrow x, and which are interrupted in the region of the path of movement of the work heads 88, 88' and serve, if necessary, for supporting at its free end the printed circuit board 12 inserted into the clamping device 10.

Endless small conveyor bands 102 of a delivery conveyor 104 are arranged between the profile rails 100 downstream of the further rails 86, 86', as seen counter to the direction of the arrow y, said small conveyor bands 102 being guided round deflecting wheels 106 adjacently to the further rails 86, 86' and in the end region of the machine. The small conveyor bands 102 can each be driven counter to the direction of the arrow y for the purpose of conveying away a machined printed circuit board 12.

The clamps 20, 22, 24 are equipped with ejectors, not shown in the Figures, which are intended, when the clamping device 10 is in the delivery position 31', (this is indicated by broken lines in FIG. 2) and when the clamping tongues 38 are brought into the open position, for lifting the ready-machined printed circuit board 12 out of the centering pins 41, 41' and for discarding it onto the delivery conveyor 104.

Before printed circuit boards 12 can be machined, the spacing A of the centering pins 41 and 41' must be set to correspond to the spacing A of the centering holes 42, 42', 42" of the printed circuit boards 12 by adjusting the second clamp 22 relative to the first clamp 20. The slide 56 of the rotation device 14 must also be displaced along the guide rail 54, until, as seen in the direction of the arrow y and in relation to the clamping device 10 located in the reception position 31, the axis of rotation 16 is arranged centrally between the centering pins 41, 41', and must be clamped there by actuating the locking device 58. For this purpose, the slide 56 must be displaced until the traveler 78 on the scale 84 points to half the length A. The machine is then ready for scoring the printed circuit boards 12.

When the clamping device 10 is in the reception position 31 and the clamping tongues 38 are brought into the open position, a printed circuit board 12 to be machined is inserted into the first and second clamps 20, 22 by hand or, if appropriate, by means of a loading device, in such a way that the centering pins 41, 41' engage into the centering holes 42, 42'. After the clamping tongues 38 have been brought into the clamping position, the scoring program is started. This positions the twin work heads 18 in the desired position and initializes the movement of the clamping device 10 into the delivery position 31' counter to the direction of the arrow y; during this movement, a first score is made in the printed circuit board 12 on both sides of the latter. After a renewed positioning of the twin work head 18, the clamping device 10 is brought into the reception position 31 again in the direction of the arrow y, with the result that a second score is formed in the printed circuit board 12. The printed circuit board 12 is machined in a first direction in this way.

Figure 5:
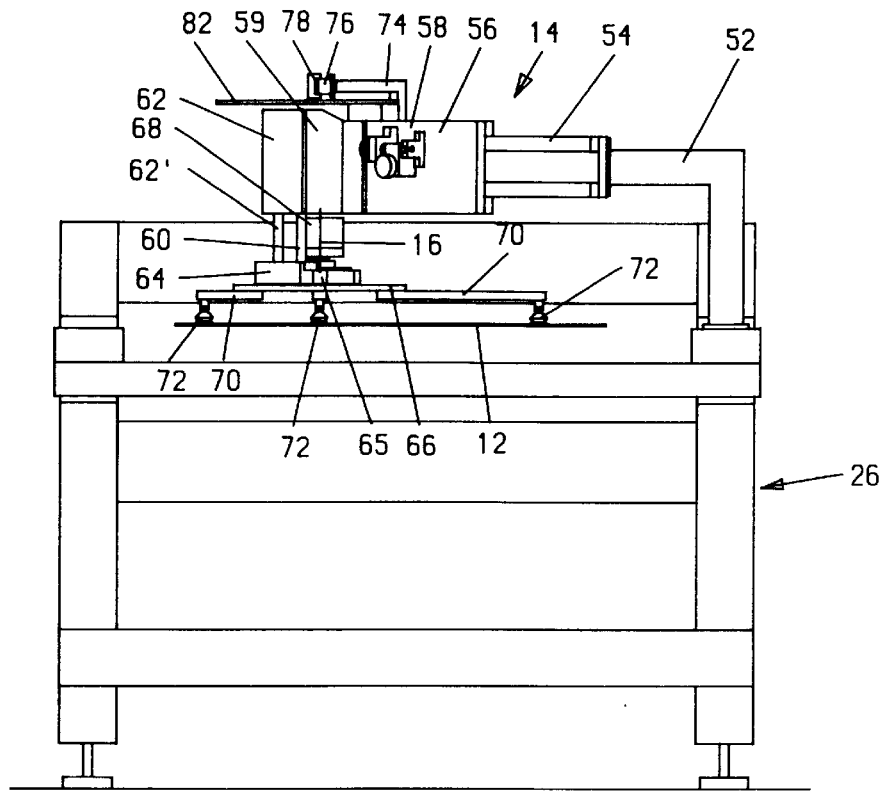
FIG. 5 shows a side view of the scoring machine shown in FIGS. 1 and 2.
Figure 6:
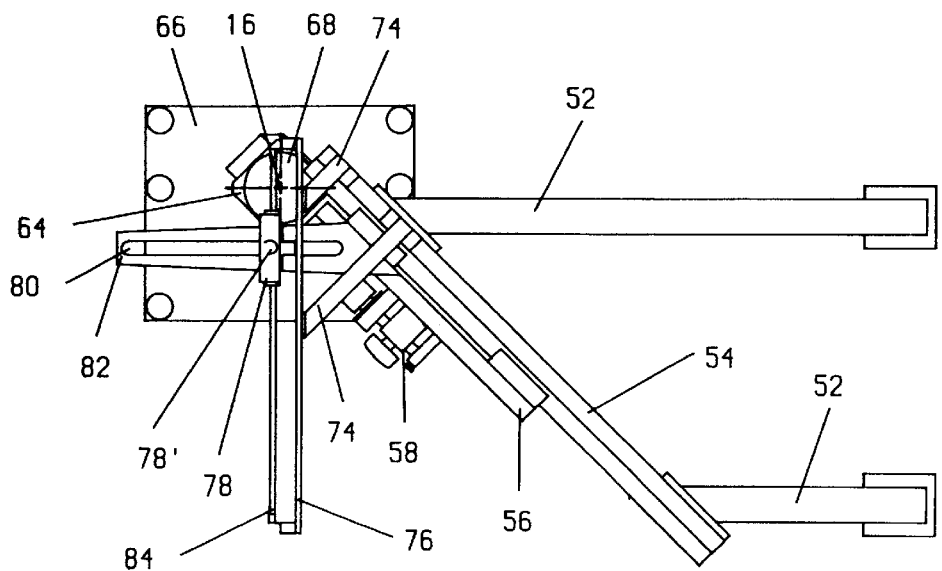
FIG. 6 shows in a top view, and enlarged in relation to FIG. 2, the rotation device of the scoring machine.

As soon as the desired scores are made, the clamping device 10 is positioned in the reception position 31 and the carrier 64 of the rotation device 14 is lowered from the position of rest, indicated by dot-and-dash lines in FIG. 5, into the working position shown by unbroken lines, until the suction heads 72 bear on the printed circuit board 12. The suction heads 72 are then connected to a vacuum source, the clamping tongues 38 are brought into the open position and the carrier 64 is raised again by means of the cylinder/piston assembly 62. The rotary drive 68 is then activated, in order to rotate the baseplate 66, together with the retained printed circuit board 12, through 90° clockwise (the direction of the arrow D). As soon as this rotation has taken place, the carrier 64 is lowered again, with the result that the centering holes 42' and 42" then come into engagement with the centering pins 41 and 41'. After the clamping tongues 38 have been brought into the clamping position, the suction heads 72 are ventilated and the carrier 64 is raised into the position of rest again. The printed circuit board 12 can then be scored in the second direction in the same way as described further above.

Figure 2:
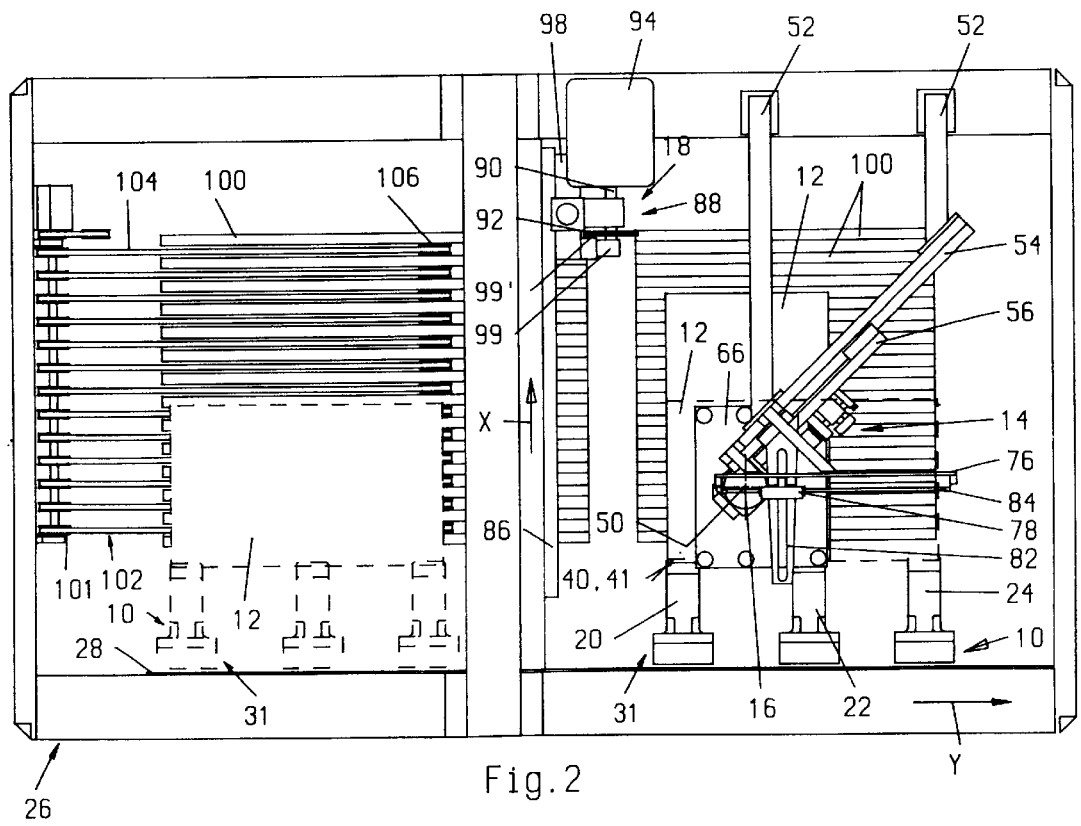
FIG. 2 shows a top view of the scoring machine shown in FIG. 1.

As soon as machining is terminated, the clamping device 10 is stopped in the delivery position 31' indicated by broken lines in FIGS. 1 and 2, the clamping tongues 38 are brought into the open position and the ready-machined printed circuit board 12 is discarded by means of the ejectors onto the delivery conveyor 104 which is then activated for conveying away the printed circuit board 12 counter to the direction of the arrow y. The clamping device 10 is then once again brought back into the reception position, where it can be loaded with a further printed circuit board 12 to be machined.

It is possible that the clamping device 10, in order to be loaded with a new printed circuit board 12, is brought in each case into a loading position which differs from the reception position 31.

It is, of course, also possible to arrange the rotation device 14 below the clamping plane 36'. It is likewise possible to position the axis of rotation 16 of the rotation device 14 in each case automatically as a function of the position of the second clamp 22 relative to the first clamp 20.

Although the axis of rotation 16 has to be displaced in the direction of the straight positioning line 50 and this is carried out in the simplest way by displacement along this straight positioning line 50, it is also possible to bring the axis of rotation 16 into the desired position in a biaxial movement.

The present invention is suitable not only for the scoring of printed circuit boards, but, in general, for the machining of sheet-like articles in two directions running at right angles to one another. By sheet-like articles are to be understood articles which are at least approximately planar and have a thickness which is small in relation to the length and width.

The printed circuit boards 12 to be machined do not always have an exactly square or rectangular shape. It is also possible for the orientation and position of the conductor track arrangements relative to the edges 46, 46' of the printed circuit boards to be different. The centering holes 42, 42' are therefore made at the desired location in relation to the conductor track arrangements, so that the lateral sides 44' of the triangle may deviate from being parallel to the edges 46, 46'.

I claim:

1. A machine for the machining of sheet-like articles comprising a toolholder for holding a tool for machining of said articles, a clamping device for the article to be machined in each case, said clamping device defining a clamping plane and having two centering members of adjustable spacing, a drive for moving the toolholder and the clamping device relative to one another in a machining direction, a rotation device for rotating the article to be machined in each case, after machining in one direction, for subsequent machining in a second direction, said rotation device having an axis of rotation which runs at least approximately at right angles to the clamping plane, means for enabling a movement of said axis of rotation in the direction of a straight positioning line running through a first of the two centering members and forming an angle of 45° with a straight base line defined by the two centering members and means for fixing said axis of rotation at the point of intersection of this straight positioning line with a mid-perpendicular between the centering members to the straight base line for the rotation of the article.

2. The machine as claimed in claim 1, wherein said means for enabling the movement of said axis of rotation comprises means for displacing said axis of rotation along the straight positioning line.

3. The machine as claimed in claim 2, wherein the rotation device has a guide rail, which runs parallel to the straight positioning line and on which a slide is mounted, and a locking means for the retention of the slide relative to the guide rail.

4. The machine as claimed in claim 3, wherein the axis of rotation is formed by the axis of a shaft which, by means of a drive arrangement, is rotatable about its axis and is displaceable back and forth in the direction of the axis.

5. The machine as claimed in claim 4, wherein the drive arrangement is arranged on the slide.

6. The machine as claimed in claim 5, wherein the shaft is provided, at its end facing the clamping plane, with a holding arrangement for the articles in the form of suction heads.

7. The machine as claimed in claim 6, wherein the clamping plane is at least approximately horizontal, and the rotation device is arranged above the clamping plane.

8. The machine as claimed in claim 1, which comprises a scale running parallel to the straight base line and a pointer arrangement for indicating the position of the axis of rotation, said pointer arrangement being displaceable together with the axis of rotation.

9. The machine as claimed in claim 1, further comprising drive means for moving the clamping device back and forth in the machining direction and for positioning the clamping device in a reception position, in which the straight positioning line runs through the first centering member.

10. The machine as claimed in claim 1, wherein the clamping device has two clamps, each having one of the centering members.

11. The machine as claimed in claim 10, wherein a drive is connected to a first clamp having the first centering member and a take-up member, in the form of a rod, which is connected fixedly to said first clamp and on which the other second clamp can be locked.

12. The machine as claimed in claim 1, wherein the centering members have centering pins which are intended for engaging in each case into two of three centering holes in the article to be machined in each case.

13. The machine as claimed in claim 3, wherein, for the purpose of machining the articles, the clamping device is moved back and forth in the machining direction and, for rotating the articles, is positioned in a reception position, in which the straight positioning line runs through the first centering member.

14. The machine as claimed in claim 9, wherein the clamping device has two clamps, each having one of the centering members.

15. The machine as claimed in claim 10, wherein centering members have centering pins which are intended for engaging in each case into two of three centering holes of the article to be machined in each case.

16. A machine for the scoring of printed circuit boards comprising a toolholder for holding a scoring tool, a clamping device for the printed circuit board to be scored in each case, said clamping device defining a clamping plane and having two centering members of adjustable spacing, a drive for moving the toolholder and the clamping device relative to one another in a machining direction, a rotation device for rotating the printed circuit board to be machined in each case, after machining in one direction, for subsequent machining in a second direction, said rotation device having an axis of rotation which runs at least approximately at right angles to the clamping plane, means for enabling a movement of said axis of rotation in the direction of a straight positioning line running through a first of the two centering members and forming an angle of 45° with a straight base line defined by the two centering members and which means for fixing said axis of rotation at the point of intersection of this straight positioning line with a mid-perpendicular between the centering members to the straight base line for the rotation of the printed circuit board.

\* \* \* \* \*